United States Patent [19]

Klinger et al.

[11] Patent Number: 5,253,143

[45] Date of Patent: Oct. 12, 1993

[54] HOUSING FOR AN ELECTRONIC CIRCUIT WITH TWO SEPARABLE HOUSING PARTS

[75] Inventors: Herbert Klinger, Nürnberg; Gerhard Thomas, Fürth; Karl Wutz, Sengenthal, all of Fed. Rep. of Germany

[73] Assignee: Robert Bosch GmbH, Stuttgart, Fed. Rep. of Germany

[21] Appl. No.: 828,945

[22] PCT Filed: Oct. 4, 1990

[86] PCT No.: PCT/DE90/00749

§ 371 Date: Feb. 5, 1992

§ 102(e) Date: Feb. 5, 1992

[87] PCT Pub. No.: WO91/07865

PCT Pub. Date: May 30, 1991

[30] Foreign Application Priority Data

Nov. 8, 1989 [DE] Fed. Rep. of Germany ....... 3937190

[51] Int. Cl.⁵ ............................................. H05K 5/06
[52] U.S. Cl. ..................................... 361/736; 361/679; 361/744; 361/800; 439/341
[58] Field of Search ................. 439/76, 271, 341; 200/303, 307; 174/52.1, 52.3; 361/380, 392–396, 356

[56] References Cited

U.S. PATENT DOCUMENTS

| | | | |
|---|---|---|---|
| 4,741,032 | 4/1988 | Hampton | 361/356 X |
| 4,850,014 | 7/1989 | Gillis et al. | 361/356 X |
| 5,057,971 | 10/1991 | Hautvast et al. | 361/395 |

FOREIGN PATENT DOCUMENTS 2554747  6/1977  Fed. Rep. of Germany .

*Primary Examiner*—Leo P. Picard
*Assistant Examiner*—Michael W. Phillips
*Attorney, Agent, or Firm*—Michael J. Striker

[57] ABSTRACT

A housing for an electronic circuit, in particular for an electronic control circuit of a motor vehicle internal combustion engine has a circuit accommodation area, a connection area, a distribution area, and a connection device for a separable electrical connection of information and supply leads. The housing has two housing parts which are separable from one another and include a first housing part having accommodating area and a second housing part having the connection area for the connection device and having the distribution area. A dividing part separates the connection area and the distribution area. Contact connections for the connection device are provided on the dividing part. The first housing part has a base wall which in a closed condition of the housing closes the second housing part.

14 Claims, 3 Drawing Sheets

HOUSING FOR AN ELECTRONIC CIRCUIT WITH TWO SEPARABLE HOUSING PARTS

BACKGROUND OF THE INVENTION

The invention concerns a housing for an electronic circuit, in particular for electronic control circuits for motor vehicle internal combustion engines, with a circuit accommodation area and a connection device for separable electrical connection of information and supply leads.

To enable correct functioning of an electronic circuit, it is often of decisive importance in vehicle engineering to accommodate this within a housing which is sealed against the environment, so as to prevent any moisture and the like from penetrating. The connection area for information and supply leads represents a particularly weak point with regard to tightness of sealing. Moreover, the reliability of function is dependent on the electromagnetic compatibility (EMC) of the electronic circuit, i.e. the housing should create a sufficiently high shielding effect. At the same time, the invention is aimed at providing a simple structure and high service- and diagnosis-friendliness.

From the DE-OS 25 54 747, a housing for an electronic control unit is known, which has panels consisting of an electronic circuit board and a lid. The circuit board and the lid are riveted together. The rivet connections make access to the electronic circuit more difficult.

SUMMARY OF THE INVENTION

Accordingly, it is an object of the present invention to provide a housing for an electronic circuit, which avoids the disadvantages of the prior art.

In keeping with these objects and with others which will become apparent hereinafter, one feature of the present invention resides, briefly stated, in a housing for an electronic circuit in which two housing parts are separable from each other, wherein a first housing part has a circuit accommodation and a second housing part accommodates a connection device.

When the housing is designed in accordance with the present invention, it has the advantage that, with a hermetically sealed and safe configuration, it is readily amenable to service and diagnosis. The housing consists of two parts which can be separated from each other and which take on different tasks. The first housing part has a circuit accommodating area, in which the electronic circuit can be arranged. The second housing part serves to provide the electrical connection for information and supply leads entering from the outside. Due to the separable construction of the two housing parts, good accessibility and high amenability to servicing and diagnosis is achieved. Due to the segregation of the electronics from the connecting device for the information and supply leads, there is a high sealing protection, making such a housing suitable even for external mounting on a vehicle. Even if moisture and the like should penetrate, through lead entrances, into the second housing part and to the connection device, the electronic circuit will be protected by virtue of the separate first housing part.

In a preferred arrangement, the two housing parts are connected to each other via a hinge. This provides for high maintenance-friendliness, since hinging open of the two housing parts enables easy access to locations which otherwise would be difficult to reach.

The connection area is separated from the distribution area preferably by a dividing wall in which the contact connections are sealed. The dividing wall thus forms yet another moisture barrier. According to a preferred embodiment example, the connection area can have an outlet with a labyrinth seal which, although it permits ventilation and discharges moisture which may have entered via the cable entries, does not allow any moisture to enter. The separate connection area makes it possible to arrange in a second housing part, namely in the distribution area, such components which do not directly form part of the electronic circuit, but which are also moisture-sensitive, such as relays, fuses, and diagnostic LEDs. An evaluation of the diagnostic LEDs may reveal a fault, without the necessity of opening the circuit location area.

The contact connections of the sealed connection device will preferably lead directly to a board which is arranged in the distribution area. This provides not only a simple structure, but also high reliability of function.

It is envisaged, in particular, that the two housing parts form two housing levels, one of these levels containing the electronic circuit, and the other level serving the connection and distribution function.

The second housing part has a tray-like shape and can be closed with the base wall of the first housing part. The base wall thus separates the circuit locating space both from the connection area and the distribution area. When the housing is opened, the circuit accommodation area is still closed, whereas the connection and distribution areas are accessible.

Seals are provided for hermetically sealing the two housing parts.

In accordance with a preferred embodiment example, the base wall of the first housing part has been configured so as to be removable. The hinge allows both housing parts to fold open, with the base wall being removable in this opened position. In the opened position, all components are readily accessible. To seal the circuit location, the base wall is preferably connected to the remaining first housing part, which is also tray-shaped, via seals. The hinge preferably connects the two tray-shaped housing parts and does not, therefore, engage on the base wall.

In accordance with another embodiment example, the base wall also forms part of the hinge. Both the first housing part and the base wall have extensions which together, in the assembled condition of base wall and housing part, form a hinge fork, which engages on a hinge pin of the second housing part. On operation of the hinge, during which the first housing part together with the base wall is offset relative to the second housing part, the outside of the extension which is allocated to the base wall lies opposite a mating bearing surface of the second housing part, thus allowing release only after a certain angle of opening is reached, with the jaw opening of the hinge fork allowing through-passage of the hinge pin.

If the hinge valves can be separated from each other in the open position, then the housing can also be taken apart. This is particularly important for the replacement of entire components, such as the first housing part which contains the electronic circuit.

For easy separation and joining of the two housing halves, a sealed electrical plug-type connection is provided, which leads from the distribution area and into the circuit location area. This connection has a contact element and an opposite contact element, in which the contact element is connected via a flexible, strain-relieved lead to the board, which is arranged in the distribution area.

A particularly high reliability of function is obtained when the opposite contact element is arranged in an electrically screened ante-room of the first housing part. The ante-room can also accommodate components which are liable to cause radio interference. The electronic circuit, which is housed in the circuit locating area, is therefore not subject to a function reducing interference irradiation.

It is envisaged, in particular, that the information and supply leads are routed via as sealed, strain-relieved cable entry into the connection area. In this way, the connection device for the separable, electrical connection of the information and supply leads is also protected against corrosion and the like. The connection of information and supply leads is preferably made via plug-type connectors.

The housing parts, in particular, are manufactured as metal diecastings. The same is true of the base wall and the dividing walls between the connection area and the distribution area, and between the ante-room and circuit locating area. The cable entry is also preferably a diecasting.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

DESCRIPTION OF AN EMBODIMENT EXAMPLE

Figure 1:
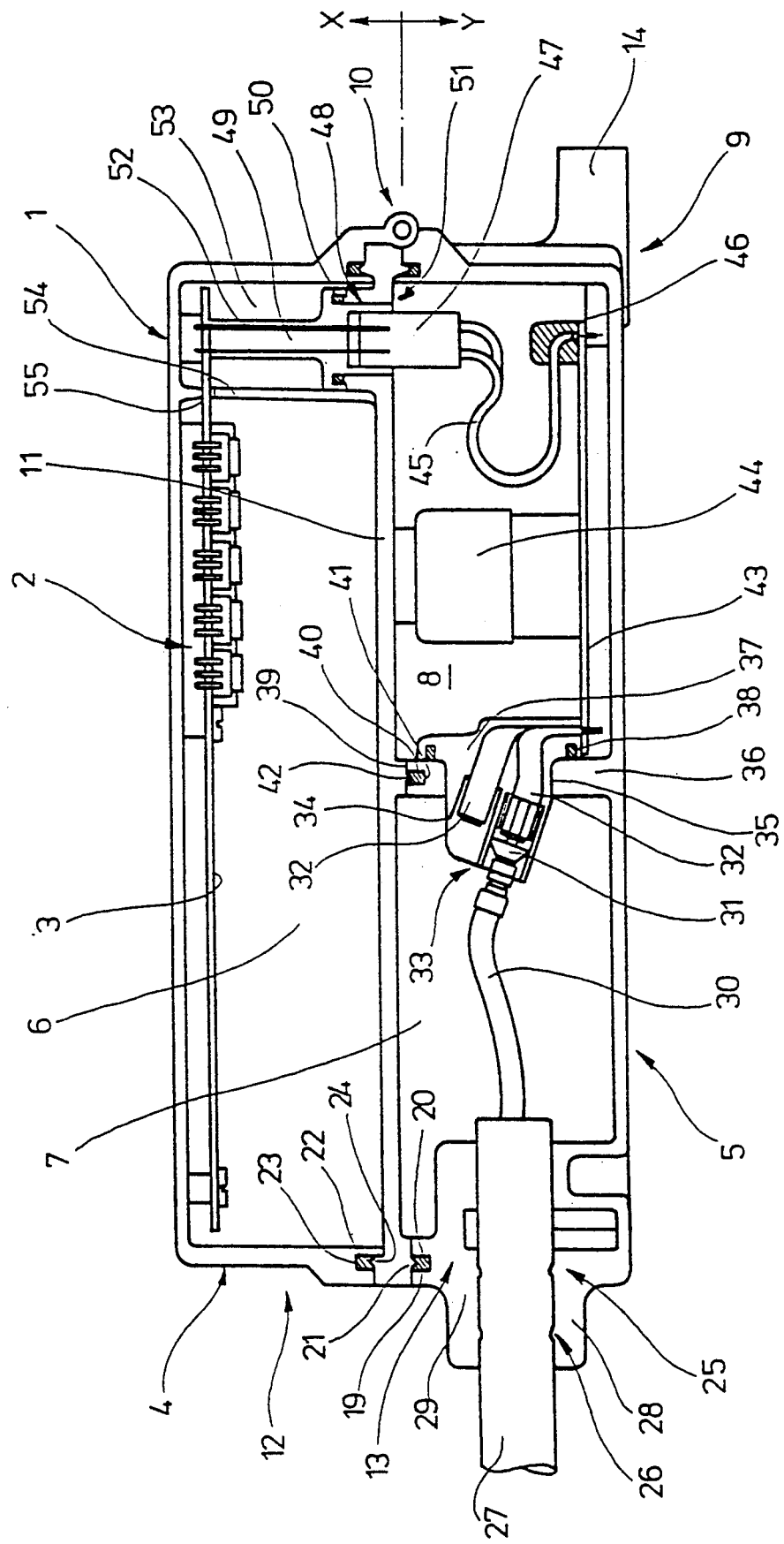
FIG. 1 a longitudinal section through a housing for an electronic circuit.
Figure 2:
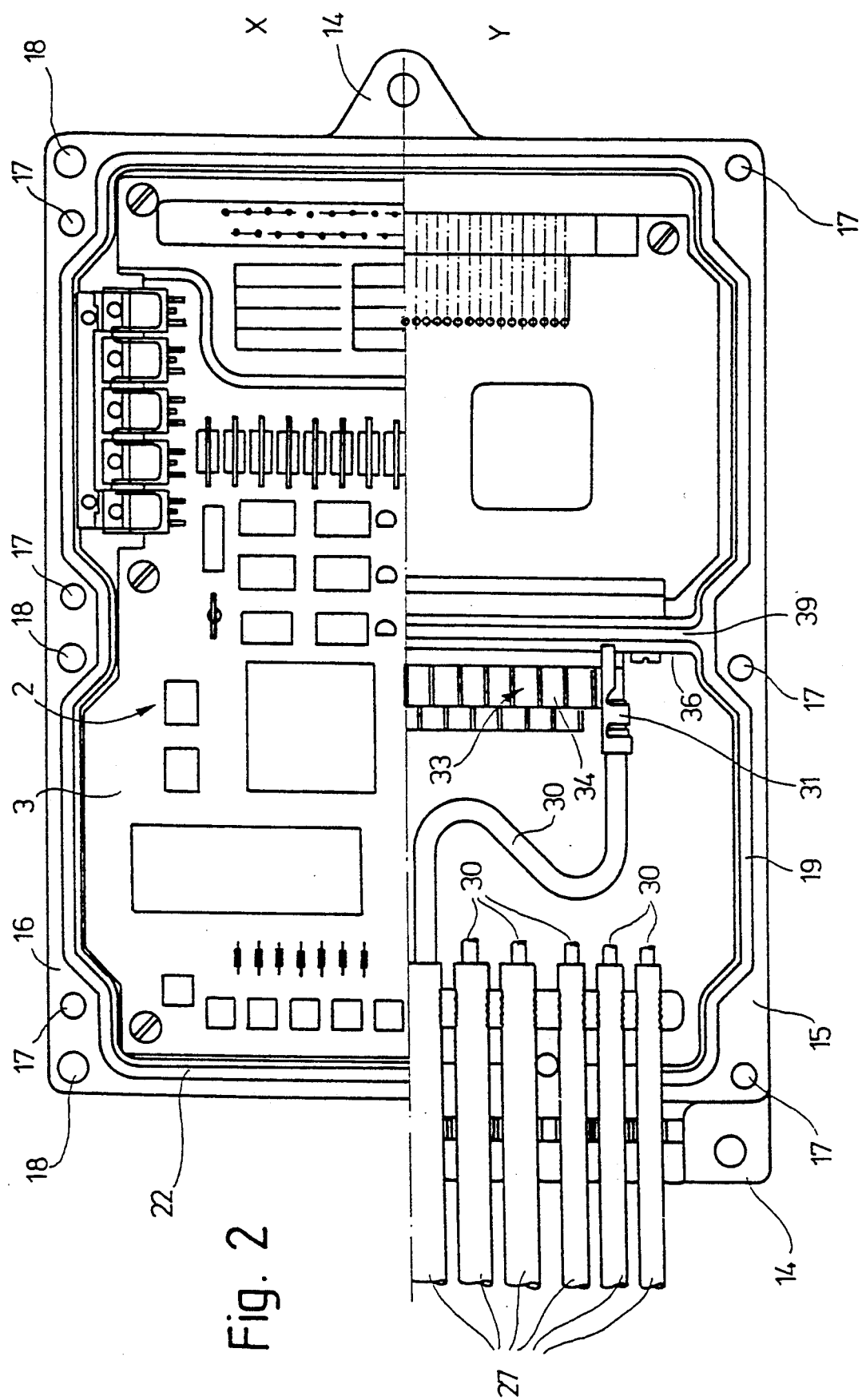
FIG. 2 a plan view of the housing in FIG. 1, viewed in the direction of the arrows x and y, and FIG. 3 a detail view of a housing hinge.

The FIG. 1 shows a housing 1 for a preferred electronic circuit 2, which is designed as the electronic control circuit of a motor vehicle internal combustion engine. The electronic circuit 2 is arranged on a circuit board 3.

The housing 1 is composed of two housing parts 4 and 5, which can be separated from each other. The first housing part 4 has a circuit location area 6, and the second housing part 5 has a connection area 7 and a distribution area 8. Both housing parts 4 and 5 are manufactured as tray-shaped, metal diecastings. They are linked to each other and are movable via a hinge 10 which is arranged on the lateral edge 9 of the housing 1. In the closed condition, the two tray-shaped housing parts 4 and 5 with their locating apertures, are opposite each other, with a base wall 11 of the first housing part 4 arranged between them and at the same time forming an upper wall for the second housing part 5. The two housing parts 4 and 5 thus form two housing levels 12 and 13. The circuit locating area 6 is located in the housing level 12, connection area 7 and distribution area 8 are arranged in the housing level.

The second housing part 5 thus forms a base part of the housing 1 and is provided with fixing flanges 14 for its mounting. Both housing parts 4 and 5 have flange collars 15 or 16 formed all around the tray edge and having threaded holes 17 or through holes 18 for setscrews, not shown here, with which the two housing parts 4 and 5 can be fixed. On its flange collar 15, the housing part 5 has an all-round groove 19 for a seal 20 which is clamped by an annular web 21 of the base wall 11.

The flange collar 16 of the housing part 1 is also provided with an all-round groove 22 accommodating a seal 23, which acts in conjunction with an annular web 24, arranged on the other side of the base wall 11.

One of the side walls 25 of the connection area 7 is designed as a cable entry 26 for information and supply leads 27. The cable entry 26 consists of a base part 28 which forms one piece with the housing part 5 and is clamped with a pressure piece 29. Due to the clamping of the base part 28 and the pressure piece 29, a strain relief is formed for the information and supply leads 27. The pressure piece 29 forms a wall area of the housing part 5. The cable entry 26 is preferably provided with a seal which engages on the casing walls of the information and supply leads 27, so that moisture is prevented from entering into the connection area 7.

The cores 30 of the information and supply leads 27 are connected via plug-type connectors 31 to contact connections 32 of a connection device 33. With its connection area 34, this device passes through a cut-out 35 of a dividing wall 36 which is formed on the housing part 5 as one piece, and which partitions the connection area 7 from the distribution area 8. The connection device has a flange area 37 which is fitted with a seal 38 and lies against that side of the dividing wall 36 which faces towards the distribution area 8. The front face 39 of the dividing wall 36 has a groove 40 which terminates in the groove 19 and which carries a seal 41, which acts in conjunction with a web 42 of the base wall 11.

The contact connections 32 of the connection device 33 are directly connected to conductor tracks of a circuit board 43 which is arranged in the distribution area 8 and which accommodates relays 44 and fuse and diagnostic LEDs and the like, not shown here. Flexible leads 45 are connected to the board 43, these leads are held by a strain relief 46. The leads 45 run to a contact element 47 of an electrical plug-type connection 48. The contact element 47 is plugged together with an opposite contact element 49, which is hermetically sealed in a cut-out 51 of the base wall 11 by means of a seal 50.

With its connection area 52, the opposite contact element 49 is in an electrically screened ante-room 53 of the housing part 4, separated from the circuit locating area 6 by a transverse wall 54 which forms one piece with the housing part 4. The board 3 of the electronic circuit 2 penetrates through a slot 55 of the transverse wall 54, so that the contact lugs of the opposite contact element 49 can be directly connected to the conductive tracks of the board 3. The ante-room 53 moreover accommodates components, not shown here, which are liable to cause radio interference.

After slackening the setscrews which hold the two housing parts 4 and 5, the housing 1 can be hinged open by the hinge 10, with the opening angle being approximately 140°. In this position, the base wall 11 can then be removed, so that all components are freely accessible. However, it is also possible to unhook the housing part 4 from the hinge 10 and to undo the plug-type connection 48, so that an exchange or a repair can be effected in a simple manner.

Figure 3:
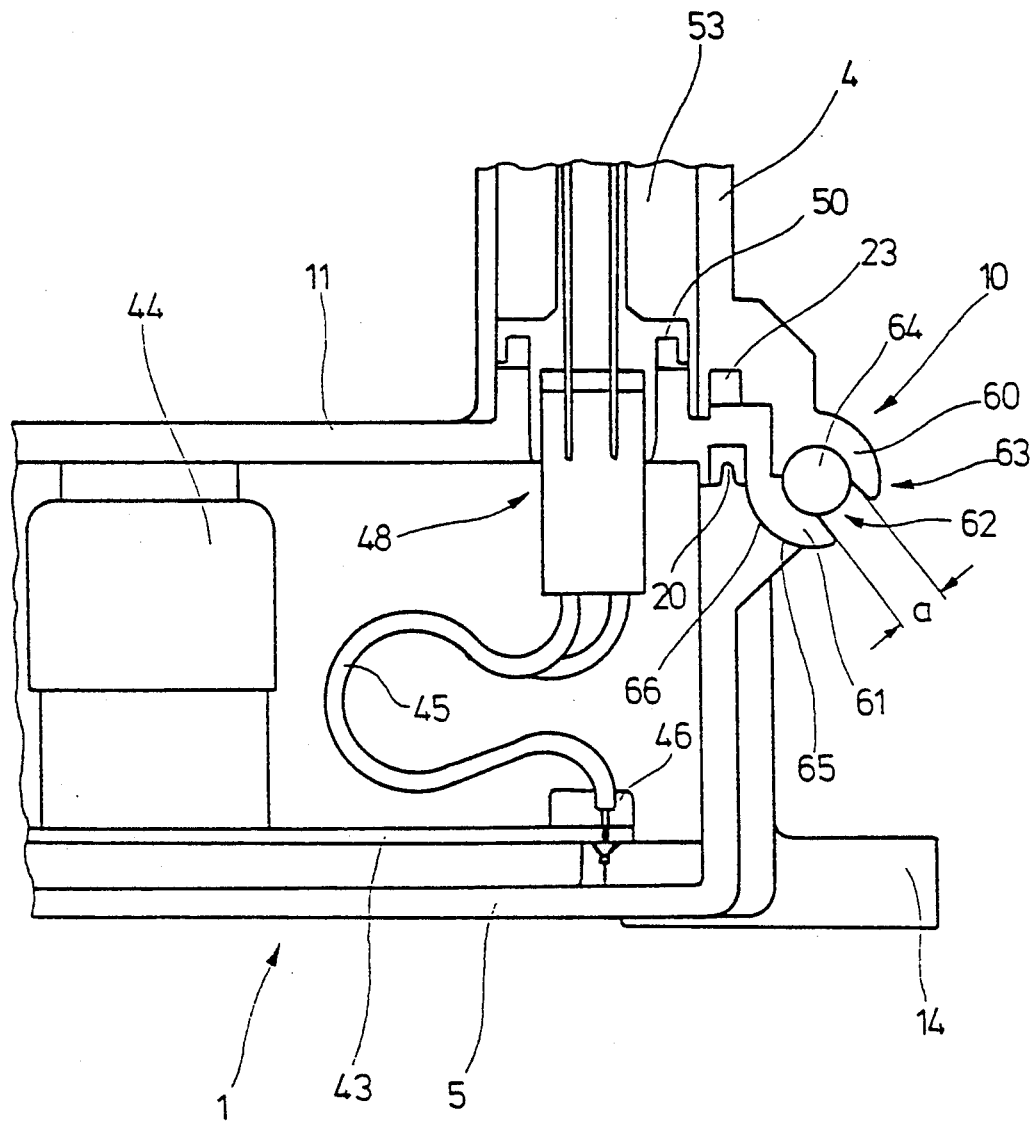

The housing 1, in particular the circuit accommodating area 6, is hermetically sealed. Even if due to the cable entry 26 being leaky moisture should have entered, this will remain in the connecting area 7 which has no sensitive components. The sophisticated sealing system ensures a high degree of protection which permits free frame assembly. Due to the metal diecastings of the housing 1, sufficient electromagnetic screening is ensured, with components subject to radio interference—such as suppressor chokes, capacitors, and filters—being housed in a special area, namely the ante-room 53. FIG. 3 shows the housing 1 in the region of the hinge 10 in accordance with another embodiment example. Both the first housing part 4 and the base wall 11 have extensions 60, 61 which form a hinge fork 63 which has an open jaw. The hinge fork 63 engages on a hinge pin 64 of the second housing part 5. In the closed condition of the housing 1 of FIG. 3, the outside 65 of the extension 61, which has an arc-like outline, lies opposite a shape matching bearing face 66 of the housing part 5, with very little play. In the position shown in FIG. 3, penetration of the hinge pin 64 through the open jaw 62 is thus prevented.

If the housing 1 is opened such that the base wall 11 and the first housing part 4 are jointly moved to be offset relative to the second housing part 5 (e.g. by 45°), then the open jaw 62, which has a slot width 'a', will point downwards, and the outside 65 of the extension 61 will be released by the bearing surface 66, so that the hinge pin 64 can pass the hinge fork 63, and the housing 1 can be dismantled. It is possible, by suitable design, to achieve a separating angle other than 45°. The hinge pin 64 is preferably designed as one piece with the second housing part 5. This also applies to the extensions 60 and 61 on the first housing part 4 and on the base wall 11.

It will be understood that each of the elements described above, or two or more together, may also find a useful application in other types of constructions differing from the types described above.

While the invention has been illustrated and described as embodied in a housing for an electronic circuit, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed as new and desired to be protected by Letters Patent is set forth in the appended claims:

1. A housing for an electronic circuit, in particular for an electronic control circuit of a motor vehicle internal combustion engine having a circuit accommodation area and a connection device for a separable electrical connection of information and supply leads, the housing comprising two housing parts which are separable from one another and include a first housing part having an accommodation area and a second housing part having a connection area for the connection device and a distribution area, said first housing part having a base wall which in a closed condition of the housing closes said second housing part; a dividing part which separates said connection area from said distribution area and is provided with contact connections for the connection device; and a board which is arranged in said distribution area, said contact connections being directly connected to said board.

2. A housing as defined in claim 1; and further comprising a hinge for movably linking said two housing parts with one another.

3. A housing as defined in claim 2; and further comprising a side wall, said housing parts being tray-shaped, said hinge connecting tray-shaped housing parts in the region of said side wall.

4. A housing as defined in claim 2, wherein said hinge has hinge halves which are separable from each other when in an open position.

5. A housing as defined in claim 1, wherein said housing parts form two housing levels.

6. A housing as defined in claim 1, wherein said second housing part is tray-shaped.

7. A housing as defined in claim 1; and further comprising seals arranged between said housing parts.

8. A housing as defined in claim 1, wherein said base wall of said first housing part is removable.

9. A housing as defined in claim 1; and further comprising seals, said base wall being connected with said first housing part via seals.

10. A housing as defined in claim 1; and further comprising a sealed electrical plug-type connection leading from said distribution area to said circuit accommodation area.

11. A housing as defined in claim 1; and further comprising a board, a flexible strain-relieved leads, and a plug-type connection which has a contact element and an opposite contact element, said contact elements being connected to said board via said flexible strain-relieved leads.

12. A housing as defined in claim 11, wherein said first housing part has an electrically shielded ante-room, said opposite contact element being arranged in said electrically shielded ante-room.

13. A housing as defined in claim 1; and further comprising a sealed, strain-relieved cable entry via which the information and supply leads are routed into said connection area.

14. A housing as defined in claim 1, wherein said housing parts are metal diecastings.

* * * * *